(12) United States Patent
Masten, Jr.

(10) Patent No.: US 10,523,193 B2
(45) Date of Patent: Dec. 31, 2019

(54) ROBUST SAFE SWITCH

(71) Applicant: James William Masten, Jr., Seattle, WA (US)

(72) Inventor: James William Masten, Jr., Seattle, WA (US)

( * ) Notice: Subject to any disclaimer, the term of this patent is extended or adjusted under 35 U.S.C. 154(b) by 296 days.

(21) Appl. No.: 15/628,588

(22) Filed: Jun. 20, 2017

(65) Prior Publication Data
US 2017/0373681 A1   Dec. 28, 2017

Related U.S. Application Data

(60) Provisional application No. 62/354,630, filed on Jun. 24, 2016, provisional application No. 62/325,678, filed on Apr. 21, 2016.

(51) Int. Cl.
| | | |
|---|---|---|
| *H02H 3/00* | (2006.01) | |
| *H03K 17/13* | (2006.01) | |
| *H02H 3/08* | (2006.01) | |
| *H02H 1/00* | (2006.01) | |
| *G01R 31/02* | (2006.01) | |
| *G01R 19/165* | (2006.01) | |
| *H02H 3/04* | (2006.01) | |
| *H02H 3/33* | (2006.01) | |

(52) U.S. Cl.
CPC ......... *H03K 17/136* (2013.01); *G01R 19/165* (2013.01); *G01R 31/025* (2013.01); *H02H 1/0007* (2013.01); *H02H 1/0015* (2013.01); *H02H 3/044* (2013.01); *H02H 3/08* (2013.01); *H02H 3/33* (2013.01)

(58) Field of Classification Search
None
See application file for complete search history.

(56) References Cited

U.S. PATENT DOCUMENTS 4,392,171 A * 7/1983 Kornrumpf ............ H01H 9/542
361/13

* cited by examiner

*Primary Examiner* — Stephen W Jackson

(57) ABSTRACT

The Robust Safe Switch and Control Device is an "Internet of Things" end effecter that provides a minimally dissipating, robust switch tightly integrated with circuit, life and property automated safety features. The device enables extended sensing and monitoring capabilities that enable the effective management of the "Internet of Things."

4 Claims, 3 Drawing Sheets

ROBUST SAFE SWITCH

BACKGROUND OF THE INVENTION

From the beginning of controlled electrical switching, arc pitting and the wear of switch contact points has been a pervasive issue that actually created significant job opportunities over many decades. With the advent of alternating current, point wear was at least somewhat normalized between the two points. And with the development of more powerful electrical machines switching apparatus became remote to the actual user as the economies of smaller wire and small currents were used to remotely switch much larger electrically activated switches.

For many decades, the salvation of remote switching of resistive and especially inductive loads was the mercury-wetted contact relay. The resurfacing of the contacts with every mechanical action provided a switching lifetime rated in the tens of millions of cycles; but recent environmental concerns have eliminated the use of mercury in routine industrial and commercial devices and more so in the household application of remote switching.

Solid state technologies created an opportunity for low power electronics to monitor the alternating current waveforms and attempt to synchronize the switch action of the actual opening and closing with the zero crossing of the waveform. The device speed of emerging solid state devices such as the Silicon-Controlled Rectifier (SCR) or Triac enabled the ambition for a zero-crossing switch. But these devices, at best, have about a 1.5 Volt drop across the device when switched on. This voltage, times the load current, is the energy dissipated as heat. For a 20 Amp load, this is 30 Watts of loss. In today's environmentally sensitive market, 30 Watts per switch is a terrible waste.

Mechanical relays on the other hand do not dissipate significant energy in the "on" state, but unlike SCRs and Triacs, which are easily switched at a zero crossing, the relatively slow mechanical relays form arcs as the contact points open or close while current flows and the resulting heat melts or pits a little of the contact points at every switch cycle. The contact points have to be specifically designed to be "self cleaning," in which case they are designed to wear out but maintain a low "on" resistance; or they are dramatically over-built in anticipation of wear. In either case, mechanical relays have a significant wear rate.

As of 2017 opportunities to extend useful functionality through the "Internet of Things" brings heightened sensitivity to the efficiencies of remote switching. Additionally over the last 20 years an increased awareness of the capability to provide life safety capabilities in circuit extension and switching devices has brought forth first Ground Fault Interrupter National Electric Code requirements for such devices. And in the last few years the requirement for Arc Fault Interrupter protection for property has become a reality.

This invention is a logical extension of the history of robust switching, the technology of embedded control, the emerging needs of an Internet-based remote switching activity, and the evolving concern to provide circuit safety as well as safety for life and property in the immediate environment of the switching activity.

Early inventions targeting more robust switching were focused on the monitoring and detection of the alternating current zero crossing as a switch point opportunity. Michael Sidman's U.S. Pat. No. 4,153,870 granted on May 8, 1979, revealed a method and apparatus to identify the zero crossing in a power circuit switched by a Triac or back-to-back SCRs.

Of significant achievement was the disclosure by Rockwell International of a monolithic solid state power controller featuring zero crossing switching and programmable or configurable current limiting in U.S. Pat. No. 4,174,496 by inventors William McFall et al, granted on Nov. 13, 1979.

A disclosure using lower-cost components for a zero-crossing switch was granted to inventor Raymond Robertson on Aug. 14, 1984, U.S. Pat. No. 4,466,038. In this invention a single unidirectional SCR is used to isolate and control circuit switching for half cycles, allowing for a near zero voltage switching opportunity to energize and close a mechanical switch.

In U.S. Pat. No. 4,767,944 granted on Aug. 30, 1988, Hiroto Takeuchi and Masahiro Hishimura confirmed that analysis had shown switch contact points to be most affected by the operation of opening under a load, as the AC cycle was more than $\pi/8$ away from a zero-crossing point. Their method supported a novel apparatus which detects and measures the exact phase angle of the alternating current and drives a mechanical relay to only open when within $\pi/8$ of a zero crossing in the alternating current phase angle. Prior to this invention, the option of using a solid state switch in AC circuits was the most likely way to extend contact point life. But Takeuchi's invention significantly extended point life and did not generate the thermal loss and heat build up as did solid state switching.

Another unique extension solution to the switch point wear issue was disclosed by Hiroyuki Nishi et al in their Oct. 1, 1991, U.S. Pat. No. 5,053,907 in which three sets of contact points are synchronized to the alternating current waveforms of three phases and operate in conjunction with three triacs for the control of three-phase motors and other equipment. This device also includes circuitry to suppress leakage current of the electronics.

The true "hybrid" relay was first disclosed by Andrew Kadah in his Dec. 16, 1997, U.S. Pat. No. 5,699,218 which used a TRIAC as the solid state switching device and a mechanical relay to carry the load current. In this method the leakage current is minimized by capacitor coupling the gate drive to the TRIAC.

John Dougherty in his U.S. Pat. No. 6,046,899 of Apr. 4, 2000, presents a method of simultaneous operation of both a solid state switch and a mechanical switch where actuation of the two devices is achieved by a common power feed. This method relies on the inherent speed of the solid state device to close or open the circuit before the mechanical components have physically connected or broken the circuit and had opportunity to arc the contact points.

Gerard Blain and Luc Raffestin, in their U.S. Pat. No. 6,347,024 B1 of Feb. 12, 2002, revealed a method of simultaneously energizing the solid state switch and the mechanical relay on the same alternating current cycle. This method incorporates a programmable device that can be configured to sequence the solid state switch and the mechanical relay in response to the relative speed of a variety of solid state switches by adjusting the timing between control signals for each particular type of switch.

Hervé Carton and Denis Flandlin, in their U.S. Pat. No. 6,643,112 B1 of Nov. 4, 2003, reveal a novel implementation of a single transistor used to eliminate the point arc of a mechanical relay. In this implementation the transistor is used in parallel with a mechanical relay to eliminate point arcing in DC circuits. And to detect the alternating current direction and only permits a mechanical switch closing or opening when the alternating current is flowing such that the transistor is forward biased and configured to initiate or terminate current flow at the next zero crossing.

Sergio Orozco in his U.S. Pat. No. 8,089,735 B2 of Jan. 3, 2012 further evolved both the method and the apparatus by integrating the temperature measurement of the solid state switch into the control process and protectively disabling the switch as the temperature rises before the solid state device is damaged by excessive heat.

Common to the significant evolutionary steps of robust switching is a relatively narrow focus towards maximizing the useful life of the switch and minimizing the operational thermal losses of the switching activity. The early Rockwell device (U.S. Pat. No. 4,174,496) stands out uniquely as an attempt to combine circuit protection with zero-crossing switching by implementing a configurable current limiting activity as an integrated functionality.

Recent technology developments have enabled the monitoring of branch circuits to not only add protection for equipment but also provide precise monitoring and control to protect human and animal life from the dangers of electric shock or electrically ignited fire. These concerns are now addressed in Ground Fault Circuit Interrupters and ARC Fault Circuit Interrupters.

The invention disclosed herein includes not only the features of a robust switch and a configurable means for circuit protection, but also includes the features of life safety (Ground Fault Interruption) and property safety (Arc Fault Interruption). This collection of features fills an important need when confronted with the opportunities of the "Internet of Things" and the intended applications of remote switching where, because of their nature, the remote components of Internet implementations imply that the only observational opportunities will be built-in to the controller.

Although the telepresence sensors are not required for a full implementation, this disclosure will illustrate that the basic apparatus configuration is constructed to provide extended environmental sensors as support to the effective management of the remote switch. Support sensing such as temperature, audio and ambient light measurement will greatly enhance the effective remote management of "Internet of Things."

This invention comprises both an apparatus which is an exceptionally robust, efficient, safe and reliable remote switching device for controlling AC-powered circuits and a method to operate said device. This device nearly eliminates the thermal dissipation common to all SCR (Silicon Controlled Rectifiers) and Triacs (Back-to-Back SCRs for full wave switching) and also nearly eliminates the wear caused by arcing of the contact points in a relay switching device. This invention includes an embedded microcomputer and sensing apparatus and a method which will schedule and control the interleaved switching action of an SCR or Triac electronic switching device and actuation of a mechanical relay creating a "Hybrid Relay," while monitoring the load and return currents for life safety and circuit current waveforms for distortion caused by arcing: thus a "Robust Safe Switch."

Still this "Robust Safe Switch," because of its intended support for the "Internet of Things" and such end effectors as motors, solenoids and other inductive loads, has the configurable ability to accommodate time-limited start-up current ramps that will exceed the normal operating current limits, while maintaining vigilant management of life safety and property safety issues.

BRIEF SUMMARY OF THE INVENTION

The emergence of the "Internet of Things" has brought new emphasis on remote switching of both resistive and inductive loads. Not only is the switching remote from the user, but the process now includes computer-adaptive automated switching—whether the computer is embedded, tied in by a wired or wireless network or a cell phone doing "app" duty to regulate some "thing" in a user's physical world.

Adaptive automated switching includes techniques that enable apparent proportional control by pulse-width modulating a simple remote on and off switch. The economy of the "Internet of Things" will depend to a large part on the useful life of the remote switch.

What is missing from the current repertoire of components to enable the Internet of Things is a cost-effective switch that is both highly reliable and energy efficient with virtually no thermal losses. Yet because this switch is by definition "remote" it must incorporate provisions to ensure the safety of equipment, lives and property.

The Hybrid Relay is a circuit that makes the best use of the Triac solid state device and the mechanical relay. The solid state electronic device is forced to work in harmony with the mechanical relay by an embedded microprocessor that also performs multiple integrated functions delivering "robust" characteristics.

The microprocessor coordinates the timing of the Triac and the mechanical relay to optimize the combined action of both devices operating in parallel on the same current flow path. The Hybrid Relay uses a Triac to initially switch the load at a zero voltage crossing. As soon as the Triac has made the switch, the mechanical relay closes when the voltage across the Triac has settled to approximately 1.5 Volts max. This voltage is too low to significantly cause arcing to the mechanical points in the relay. But as soon as the mechanical relay is made, the thermal dissipation across the Triac is reduced to zero as the mechanical contacts of the relay present a very low resistance path to the current flow. Because the Hybrid Relay is operating in a fixed-frequency environment of either 50 or 60 cycles per second, the timing is a fixed period that more than encompasses the operating time of the mechanical relay. After the mechanical relay has had time to close, the drive voltage to the Triac gate can be removed by the microprocessor and applied again prior to the opening of the mechanical relay.

Additionally, the microprocessor enables "Robust" characteristics by monitoring the total current that is passing through the switch. If the current draw becomes excessive compared to a configurable reference, then the microprocessor will command the Hybrid Relay to open the circuit.

Further, the microprocessor monitors the combined current of the load and the return legs of the circuit. If there is an imbalance of more than a few milliAmps (i.e., a Ground Fault), the circuit will open. Simultaneously, the microprocessor continuously monitors the circuit waveforms and frequency. Significant deviations from a smooth 60 cycle alternating current will be detected as an ARC Fault.

And finally, the microprocessor provides visible status indication through the use of LEDs to indicate a fault condition of excessive current draw, a Ground Fault or an ARC Fault and the operational state of the Hybrid relay. If the Robust Safe Switch is configured with a network extension processor, the average and peak current flow, as well as the fault status, are also sent to the network processor.

Although the Robust Safe Switch is configured to operate as a near direct replacement for a standard remote solid state or mechanical relay requiring only a wired AC or DC control voltage signal to enable operation, the device is also equipped with a two-wire network interface to operate as an extension of an embedded wired or wireless network control processor.

When the Robust Safe Switch operates as an extension of a network control processor, the safety and power-saving features are extended to remote functionality, such as manual remote control or automated response control, such as turning off power when a smoke detector sounds.

Figure 1:
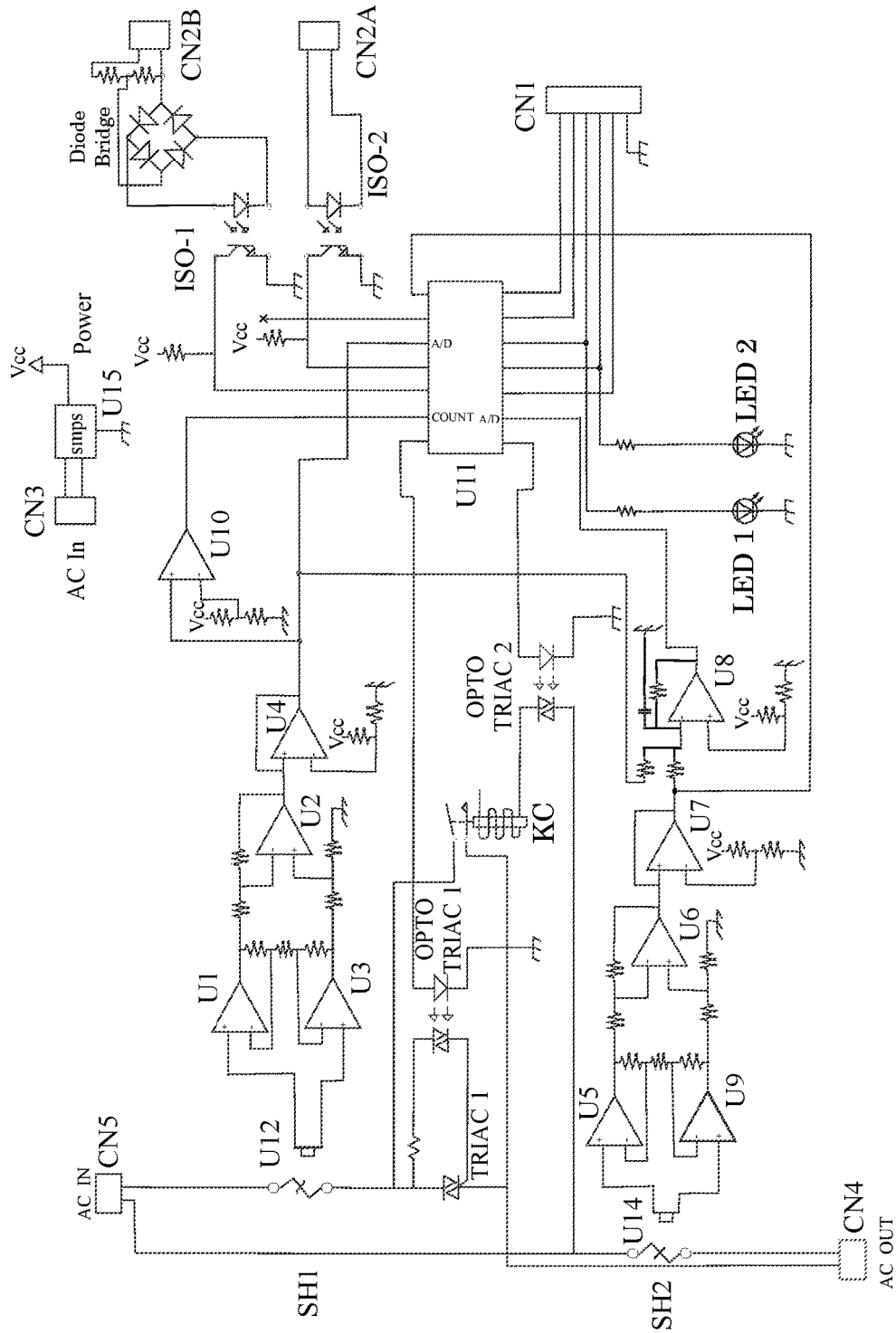
FIG. 1 represents a typical electrical schematic of the functionality of the Robust Safe Switch incorporating the functionality of the Hybrid Relay, indicating the major functional components.

| Reference Signs | Description |
| --- | --- |
| CN1 | External connector extending internal power and control to a network interface processor |
| CN2A | DC input control signal connector |
| CN2B | AC line input control signal connector |
| CN3 | Input Connector delivering AC Power from the line to the local "switch mode power supply" |
| CN4 | Connector delivering AC Line and Neutral Power out of the Robust Switch |
| CN5 | Connector delivering AC Line and Neutral Power in to the Robust Switch |
| ISO-1 | Opto-isolated input open collector diode triggered by the presence of an AC (Line) input at CN2B |
| ISO-2 | Opto-isolated input open collector diode triggered by the presence of a DC input at CN2A |
| KC | Mechanical Relay in parallel with TRIAC 1 carrying the AC LOAD in the steady state |
| LED1 | Status indicator LED |
| LED2 | Status indicator LED |
| OPTO TRIAC 1 | Optically isolated AC buffer switch between U11 and TRIAC 1 |
| OPTO TRIAC 2 | Optically isolated AC buffer switch between U11 and relay KC |
| SH1 | Current shunt on the AC "Hot" or "LOAD" side |
| SH2 | Current shunt of the AC Neutral side |
| TRIAC 1 | Power TRIAC carrying the AC LOAD during all switching operations |
| U1 and U3 | Differential amplifier pair providing isolation |
| U2 | Differential amplifier |
| U4 | Level shifting unity gain amplifier |
| U5 and U9 | Differential amplifier pair providing isolation |
| U6 | Differential amplifier |
| U7 | Level shifting unity gain amplifier |
| U8 | Summing amplifier, summing the detected current levels between the out-of-phase AC "Hot" and AC "Neutral |
| U10 | Hard limiting comparator, square wave frequency detector |
| U11 | Programmable, highly integrated resource circuit featuring, Analog-to-Digital Converters, Counters, Timers, digital outputs and communication buses |
| U12 | Differential shunt voltage pickup on the LOAD side of the AC |
| U14 | Differential shunt voltage pickup on the Neutral side of the AC |
| U15 | Switch Mode Power Supply integrated circuit controller |
| 1 | Network Extension Processor |
| 2 | System on a Chip (SOC) |
| 3 | Robust Safe Switch |
| 9 | Ambient Light Sensor of the network processor |
| 10 | DC trigger connector on network processor |
| 11 | Interprocessor bus connector on network processor |
| 12 | Barometric Pressure Sensor of the network processor |
| 13 | The ARM processor of the network processor |
| 14 | Ethernet connector to a physical Local Area Network |
| 15 | Microphone peripheral of the network processor |
| 16 | Humidity sensor of the network processor |
| 17 | Temperature sensor of the network processor |
| 18 | Projected Infrared temperature sensor measuring "off-board" temperature |
| 20 | WiFi radio of the network processor |
| 21 | BlueTooth radio of the network processor |
| 22 | ZigBee radio of the network processor |
| 23 | Physical antenna of the WiFi radio |
| 24 | Physical antenna of the ZigBee radio |
| 25 | Physical antenna of the BlueTooth radio |

DETAILED DESCRIPTION OF THE INVENTION

The Robust Safe Switch circuit performs several separate functions simultaneously using a hybrid mix of analog and digital circuitry. The following description is notional, or an example. The circuit could be implemented with a variety of circuit components able to provide the method functionality.

ISO-1 and ISO-2 are open collector type opto-isolators that enable the circuit to be controlled by virtually any type of device that can source a minimum amount of current at a minimum voltage. The circuit can be configured on the inputs to connector CN2A to operate as driven by an AC/Neutral input or to be driven by a separate DC source CN2B. ISO-1 and ISO-2 completely isolate the circuit from the devices providing the driving current to CN2B and CN2A, respectively.

U15 is a highly efficient Switch Mode Power Supply (smps) providing DC power from the AC Line voltage, as presented in FIG. 1 to be 120-240 Volts AC. Such an smps power supply could be created using an integrated circuit or created from discrete components. The power supply for this circuit need only be sufficient and is not a critical component of the functionality.

CN1 is the connector that links the Robust Safe Switch to a controller module that will support wired and wireless networking to enable the Robust Safe Switch to be the end effecter component of an Internet of Things system. The connector provides all of the inner process component controls to enable monitoring and augmented control of the Robust Safe Switch internal system, including an interprocessor bus.

Figure 2:
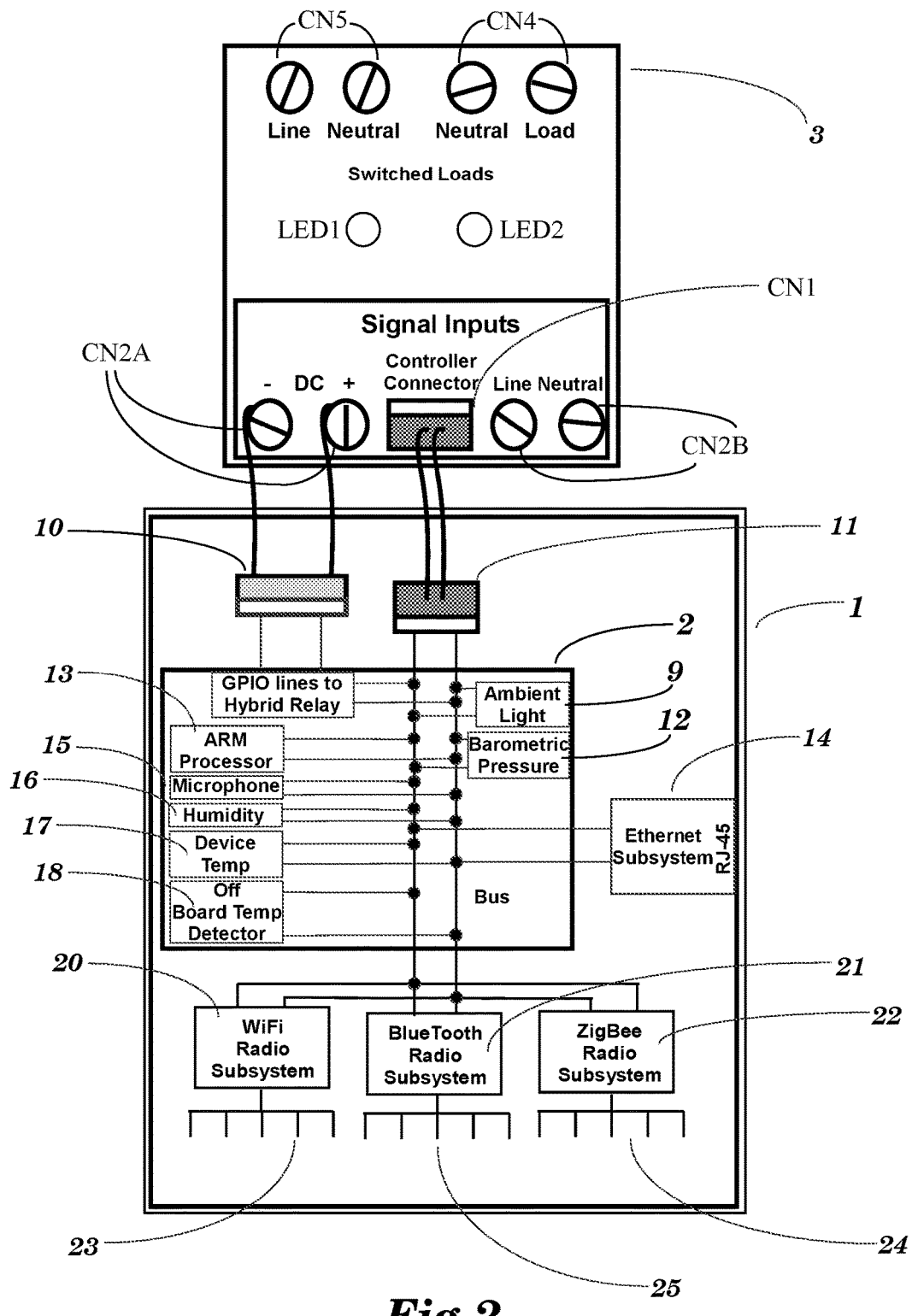
FIG. 2 is an expansion of the Robust Safe Switch which makes use of the interprocessor bus connectivity to enable true remote wired or wireless features as well as the added functionality of many easily integrated hardware capabilities such as "Off Board Temperature," temperature of the electronics, a microphone and/or a visible light detector.

The Robust Safe Switch extension processor (see FIG. 2) adds an integrated System on a Chip (SOC) with a central processing unit (a low power ARM processor) using an interprocessor bus interface to a programmable radio system, or separate radio systems such as Bluetooth, ZigBee or WiFi radio subsystems, or any combination thereof.

The principal control circuitry presented in FIG. 1 showing CPU (U11) uses opto-isolated OPTO TRIAC 1 to initialize all AC switching operations. When the load is fully carried across the TRIAC 1, then the CPU (U11) will energize or de-energize mechanical relay (KC) by driving opto-isolated OPTO TRIAC 2 to power the relay (KC) or removing the drive from OPTO TRIAC 2 to de-energize relay (KC). After the load is fully carried across relay (KC) or fully removed from the relay (KC), the CPU (U11) will release the drive on OPTO TRIAC 1. (Note that this is not the only configuration, nor even the most optimal configuration, both OPTO TRIAC 1 and OPTO TRIAC 2 could be replaced by transistor or CMOS drives.)

This action ensures that the voltage across the mechanical relay KC is never greater than the saturation voltage of the TRIAC 1 during a relay KC switching action. The TRIAC 1 is used to eliminate the arcing and contact wear in the relay KC. The use of the relay KC to carry the steady-state load eliminates the dissipation factor of the TRIAC 1 during a continuous duty operation. Thus a significant energy savings and a dramatically extended useful life expectancy of both TRIAC 1 and relay KC are maintained.

Operational amplifiers U1, U2, U3 and U4 provide an isolation differential amplifier monitoring current shunt SH1 interface U12 which could be a zero-loss Hall Effect device. SH1 accurately measures the current flowing through the "hot" side of the AC supply circuit which will be controlled and monitored to supply the "load" side of the hybrid relay.

Operational amplifiers U5, U6, U7 and U9 provide a similar function on the neutral leg of the AC supply circuit. The outputs of both differential amplifier circuits are fed into summing and level-shifting amplifier U8.

Both U7 and U4 have offset circuits that have been conditioned to set the measured current flow of the neutral shunt monitoring SH2 through interface U14 (which again could be a zero-loss Hall Effect device) and SH1 through interface U12, representing the AC "hot" side current, to be precisely one half $V_{cc}$ when the monitored current is zero respectively in each measured side of the AC circuit.

The low-pass summing amplifier U8 will sum the measured current in the neutral leg of the AC with the out-of-phase AC "hot" leg measured current and amplify the result. The amplified sum is detected by the Analog-to-Digital converter in U11, where the digital representation of the sum will be compared to a programmable leakage current limit. Excessive current will indicate a Ground Fault condition.

Upon a Ground Fault Condition, the CPU U11 will implement an immediate shutdown and issue an appropriate signal on LED1 and LED2 to indicate that a GROUND FAULT has occurred.

Removing power from the Robust Safe Switch will reset the GROUND FAULT detection.

Comparator U10 is configured to compare the measured current of the AC "hot" leg as represented by the voltage across SH1 to the approximated mid-scale of the voltage swing of the representative signal from SH1 through interface U12. Comparator U10 will hard limit and create a square wave representative of the frequency of the current signal monitored by SH1. This frequency representative signal will be fed into U11 where a counter output will read by the CPU U11. Significant deviations from the expected frequency will be considered indications of ARC FAULT. An ARC FAULT will cause the CPU to issue the commands to open the AC circuit and send a notification signal pattern to LED1 and LED2.

Resetting the AC power will resent the ARC FAULT status.

The well conditioned output of U4 represents the current flowing to the load and it is fed to a high performance Analog-to-Digital Converter A/D. The output of the converter is used by the CPU (U11) to compare the current flowing through the load to the expected (configured) limits.

Acceptable current limits can be configured at manufacturing (or field configured with a network connector adapter and a cell phone "app" or through a connected network processor) to apply just to the configurable startup period of, for example, 2 seconds to follow one of several available motor startup curves. During the startup period, the circuit continues to monitor the current flow for indications of GROUND FAULT and ARC FAULT conditions.

After the startup period, the CPU (U11) compares the maximum permissible current to a normal or "run time" expected limit. Any current measurements that do not meet the expected values for startup or run situations will be considered faults and the hybrid relay will be commanded to shut off the flow of AC current and CPU (U11) will issue the appropriate status signal patterns on signal LED1 and LED2.

During all operations, the CPU (U11) is available through a two-wire bus available at connector CN1. This bus enables the use of the Robust Safe Switch as an effective and efficient end-effecter for a network centric controller and the extension of a wired or wirelessly connected network, including the Internet, to the low level of remote switching.

The external connector CN1 links the Robust Safe Switch to a network processor extension 1, through interprocessor bus connector 11, which will enable wired and wireless networking to enable the Robust Safe Switch 3 to be the end effecter component of an "Internet of Things" system. The connector 11 provides all of the inner process component controls to enable monitoring and augmented control of the Robust Safe Switch internal system through the interprocessor bus.

It is possible that an adapter with a wireless connection could be temporarily connected to connector CN1 on the Robust Safe Switch 3, which would enable a smart phone "app" to field reconfigure the set points for the current limit or to read the current load on the circuit in real-time.

The Network Extension Processor 1 (see FIG. 2) adds an integrated System on a Chip (SOC) 2 with a central processing unit 13 (a low power ARM processor) using the interprocessor bus interface 11 to link the Robust Safe Switch 3 to the network processor subsystem 1 featuring a wired 14 or a wireless 20, 21, 22 network system. Wireless systems could be any or all of a low-power Bluetooth 21, a ZigBee 22 and/or a WiFi 20 radio system. Each of these radio system could utilize an external antenna or integrated circuit-board antennas 23, 24, 25.

Currently many of these households do not have the ability to use a controlled network to assist them in the control and the operation of appliances. These people are outside of the Internet. But the Robust Safe Switch technology is extending the Network of Things to those without access to the Internet.

The Robust Safe Switch with the Network Extension processor features could be configured with a BlueTooth 21 and a ZigBee radio system 22 delivering control and mesh networking. The ZigBee units 22 will automatically network together and enable a rural home owner without benefit of the Internet or WiFi to use his cell phone as an interface to control an impromptu Internet of Things network. Such a system could include heaters and other appliances like window-mounted air conditioners, lighting and gate controllers. As shown on FIG. 2, the SOC could include telepresence sensors to detect and report environmental parameters such as humidity 16, device temperature 17, projected temperature 18, ambient light 9, or barometric pressure 12. Through Network Extension processor 1 and interface CN1, the homeowner can control the home environment and other appliances, through a computer or phone "app" or through an on-board microphone interface 15. The embedded microcontroller U11 could be configured to maintain schedules downloaded to each device and monitored through the ZigBee Mesh when the cell phone is within range of its BlueTooth signal.

The apparatus described herein employing the method as described dramatically extends the capability to effectively and safely manage the "end effect" of the long reach of the "Internet of Things". Although not currently required by code at all locations suitable for extension through the Internet of Things, the concern for circuit, life and property safety should be reasonably considered as the power of the Internet reaches to the practicalities of remote control to the masses.

Detailed Description of the Method Logic Flow Chart

Figure 3:
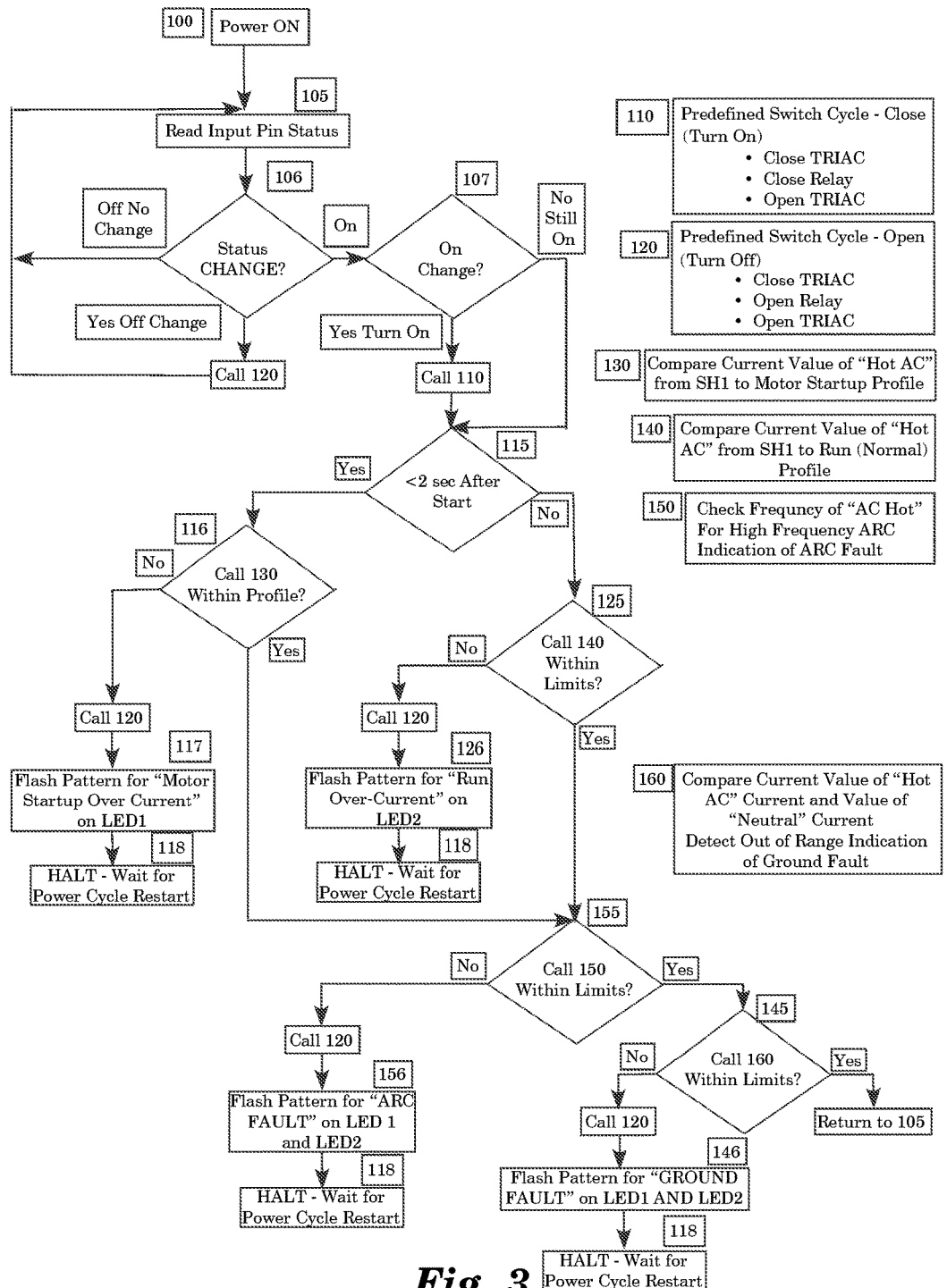
FIG. 3 is a functional flow chart of the logic of the embedded functionality within the Robust Safe Switch.

As shown in FIG. 3, at power up 100 the processor resets to read the input status pin 105 and then evaluates the status as changed to "off" 120 or "off" no change then loops back to read the pin again at 105. If the pin reads "on," control moves to 107 to test for persistence (i.e., still on) 115 or a change to "on" 110.

If the circuit is just turned on then sub-routine 110 operates the interleaving cycle of energizing TRIAC 1 for a zero crossing switching action to power the circuit, then energizing the mechanical relay KC after the TRIAC 1 has settled and the voltage to be switched is near a minimum 1.5 volts and then un-powering the TRIAC 1 after the mechanical relay KC has settled.

If the circuit is still on, then routine 115 evaluates whether the process is still inside a preset or configurable motor startup current ramp. If it is, then control advances to process 116 where the program execution time is compared with the table stating the allowable current at that preset or configurable time window of control for the "motor start up" current control ramp (e.g. a current limit that varies as a function of time). If within the time window of startup current ramp then control is advanced to process 130 where the measured current is compared to the selected ramp profile. If the measured current is not within the profile then control advances to process 120. At process 120, TRIAC 1 is energized to pick up the load from the mechanical relay KC at the next zero voltage crossing. This action allows the mechanical relay KC to open at a minimal voltage across the relay contact points on KC. After the mechanical relay KC has settled into the open condition, TRIAC 1 is de-powered at the next zero crossing, again minimizing both switching arcing and thermal dissipation. Return from process 120 advances to the LED message display 117, where the "Motor Startup Over Current" indication is displayed on signal LEDs LED1, LED2. After a preset or configurable presentation time, the Robust Safe Switch will halt and wait for a power cycle to reset 118.

If the measured current is within the stated measurement profile, then program control is advanced to process 155 where process 150 results for high frequency ARC fault test conditions are evaluated. If an ARC fault condition is detected, then control is advanced to process 120 for shutdown and upon return to process 156 "ARC FAULT" indications are flashed on the signal LEDs LED1, LED2. After a preset or configurable presentation time, the Robust Safe Switch will halt and wait for a power cycle to reset, 118.

If an ARC FAULT condition is not detected then control advances to 145 where the return values for process 160 are evaluated for indications of a GROUND FAULT condition of leakage current to ground. If the evaluation indicates that the GROUND FAULT conditions have existed for a time period to exceed the threshold, then control will shift to shut down procedure 120 to shut down power and upon return to 146 "GROUND FAULT" indications are flashed on the signal LEDs LED1, LED2. After a preset or configurable presentation time, the Robust Safe Switch will halt and wait for a power cycle to reset, 118.

If the "on time" exceeds the "motor start up ramp" timer then control moves to process 125 where the results from sub-routine 140 are evaluated and the preconfigured or configurable "normal runtime" current" limits are used to test the measured AC "hot" load current. If the measured current exceeds the limit then shutdown process 120 is called and upon return process 126 is called to flash "Run Over Current" on the signal LEDs LED1, LED2. After a preset or configurable presentation time, the Robust Safe Switch will halt and wait for a power cycle to reset, 118.

If the measured current does not exceed the limits of sub-routine 140, then control is passed to process 155 where process 150 and then process 160 are called. If the results of 150 and then 160 are within limits, control is returned to process 105 and the control loop is repeated.

The invention claimed is:

1. A method whereby an embedded microcomputer, a programmable logic controller or custom configured logic will schedule and control an interleaved Alternating Current switching action of both a zero-crossing switch which always opens or closes when circuit voltage crosses zero volts and a minimally dissipative switch which consumes or dissipates minimal power when holding in either an on or off switch condition, the method comprising:
   instructing the zero-crossing switch to remain closed for enough cycles to allow the minimally dissipative switch to settle to either an on or off position;
   instructing the zero-crossing switch to always return to a high impedance or off state when the minimally dissipative switch has settled to either an on or off state;
   wherein the switching action is used as a single activity to turn a circuit on and/or off by command or on a configurable schedule,
   wherein the microcomputer, programmable logic controller or custom configured logic monitors current flow in load and return conductors for Over-Current, GROUND Fault and/or ARC Fault conditions,
   wherein an Over-Current condition is indicated when the monitored current in the AC circuit exceeds a preset threshold in both magnitude and time,
   wherein an Over-Current condition is indicated when the monitored current in the AC circuit exceeds a programmable threshold in both magnitude and time,
   wherein the circuit is opened when an Over-Current condition is detected,
   constantly measuring a differential current as a difference current magnitude of the load and return lines to detect leakage to Ground current,
   wherein leakage current to Ground above a preset or configurable magnitude for a configurable or preset duration of time is detected as a GROUND Fault,
   wherein the circuit is opened when a GROUND Fault is detected,
   wherein measurements of the magnitude and frequency of the switched AC amperage applied to the load are incrementally compared to a preset or configurable reference standard,
   wherein a preset or a configurable difference between the measured values of magnitude and frequency and a reference standard for a preset or a configurable duration of time indicates an ARC Fault condition, and
   wherein the circuit is opened when an ARC Fault is detected.

2. The method of claim 1 wherein the embedded microcomputer, programmable logic controller or custom configured logic monitors the current flow in the circuit of the switched AC power for Over-Current detection, with a preset or a programmable motor start-up ramp feature which, when measured against a configurable time varying profile to accommodate various start-up current draws
   wherein an Over-Current condition is indicated when the monitored current in the AC Hot circuit exceeds a preset or a configurable time-varying threshold, and
   wherein the circuit is opened when an Over-Current condition is detected.

3. An apparatus in support of the Method described in claim 1 of a zero-crossing switching device implemented in parallel with a minimally dissipative switching device that simultaneously monitors the current flow in the load and return conductors of the Alternating Current power supply to simultaneously provide Over-Current, GROUND Fault and ARC Fault circuit protection,
   wherein a mechanically or electrically latching mechanical relay and a full-wave electronic switch are implemented in parallel
   wherein an embedded controller or programmable logic circuit or dedicated electronic logic is implemented to configure the full-wave electronic switch to carry all switching actions; the mechanical relay is configured to carry all loads after the settling of the switching action and the TRIAC is returned to the high impedance state when the controller configures the circuit to be in either the on or the off condition,
   wherein a current shunt or current detecting device are used on all load and return conductors of the AC power supply to provide high frequency, large dynamic range monitoring of the current wave forms, and
   wherein an embedded controller enables detection and resolution of the outputs of the current monitoring devices.

4. An apparatus in support of the method of claim 1 wherein the functionality of an embedded microcomputer, a programmable logic controller or custom configured logic has a network-extensible interface that enables two way communication between the apparatus and a netcentric controller,
   wherein the netcentric controller includes environmental sensors to aid in the situational awareness through telepresence in support of the Internet of Things, and
   wherein the netcentric controller includes a wired and/or wireless communications capability.

* * * * *